US012016172B2

(12) United States Patent
Harada et al.

(10) Patent No.: US 12,016,172 B2
(45) Date of Patent: Jun. 18, 2024

(54) SGT MEMORY DEVICE WITH IMPROVED WRITE ERRORS

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

(*) Notice: Subject to any disclaimer, the term of this patent is extended or adjusted under 35 U.S.C. 154(b) by 155 days.

(21) Appl. No.: 17/713,839

(22) Filed: Apr. 5, 2022

(65) Prior Publication Data
US 2022/0320098 A1   Oct. 6, 2022

(30) Foreign Application Priority Data
Apr. 6, 2021   (WO) .................. PCT/JP2021/014601

(51) Int. Cl.
G11C 11/401   (2006.01)
G11C 11/40    (2006.01)
(Continued)

(52) U.S. Cl.
CPC .............. H10B 12/20 (2023.02); G11C 11/40 (2013.01); G11C 11/401 (2013.01);
(Continued)

(58) Field of Classification Search
CPC .................................................... G11C 11/404
See application file for complete search history.

(56) References Cited

U.S. PATENT DOCUMENTS 6,137,128 A * 10/2000 Holmes .............. H10B 12/0383
257/302
2003/0111681 A1   6/2003 Kawanaka
(Continued)

FOREIGN PATENT DOCUMENTS

JP   H 02-188966 A   7/1990
JP   H 03-171768 A   7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).
(Continued)

*Primary Examiner* — Mushfique Siddique
(74) *Attorney, Agent, or Firm* — Crowell & Moring LLP

(57) ABSTRACT

An $N^+$ layer connects to the bottom portion of a Si pillar standing on a substrate 1 and an $N^+$ layer connects to the top portion of the Si pillar. Of the $N^+$ layer and the $N^+$ layer, one serves as the source and the other serves as the drain. A region of the Si pillar between the $N^+$ layer and the $N^+$ layer serves as a channel region. A first gate insulating layer surrounds the lower portion of the Si pillar and a second gate insulating layer surrounds the upper portion of the Si pillar. The first gate insulating layer and the second gate insulating layer are respectively disposed in contact with or near the $N^+$ layers serving as the source and the drain. A first gate conductor layer and a second gate conductor layer surround the first gate insulating layer. The first gate conductor layer and the second gate conductor layer are formed so as to surround the first gate insulating layer and to be isolated from each other. A third gate conductor layer surrounds the
(Continued)

second gate insulating layer. Thus, a dynamic flash memory cell is formed.

9 Claims, 10 Drawing Sheets

(51) Int. Cl.
  *G11C 11/404* (2006.01)
  *G11C 11/4096* (2006.01)
  *H10B 12/00* (2023.01)
(52) U.S. Cl.
  CPC ........ *G11C 11/404* (2013.01); *G11C 11/4096* (2013.01); *H10B 12/036* (2023.02)

(56) References Cited

U.S. PATENT DOCUMENTS

| | | | |
|---|---|---|---|
| 2008/0137394 | A1 | 6/2008 | Shimano |
| 2008/0239789 | A1 | 10/2008 | Shino et al. |
| 2011/0116316 | A1 | 5/2011 | Ueda |
| 2011/0193153 | A1 | 8/2011 | Higuchi |
| 2015/0325444 | A1 | 11/2015 | Masuoka et al. |
| 2016/0013312 | A1 | 1/2016 | Fujimoto |
| 2016/0204251 | A1* | 7/2016 | Masuoka ........ H01L 21/823814 257/329 |
| 2017/0040329 | A1 | 2/2017 | Masuoka et al. |
| 2017/0309632 | A1* | 10/2017 | Masuoka ........ H01L 21/823814 |
| 2017/0330623 | A1 | 11/2017 | Kim et al. |
| 2022/0367467 | A1* | 11/2022 | Harada ................. H10B 12/20 |
| 2022/0367474 | A1* | 11/2022 | Sakui ................... H10B 12/20 |

FOREIGN PATENT DOCUMENTS

| | | | | |
|---|---|---|---|---|
| JP | 2003-188279 | A | | 7/2003 |
| JP | 3957774 | B2 | | 8/2007 |
| JP | 2008-124209 | A | | 5/2008 |
| JP | 2008124209 | A | * | 5/2008 ........... G11C 11/404 |
| JP | 2008-147514 | A | | 6/2008 |
| JP | 2011-165815 | A | | 8/2011 |
| WO | WO 2009-090892 | A1 | | 7/2009 |
| WO | WO 2014-136728 | A1 | | 9/2014 |
| WO | WO 2014-184933 | A1 | | 11/2014 |
| WO | WO-2014184933 | A1 | * | 11/2014 ....... H01L 21/28158 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).
H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).
T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).
W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).
M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).
J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).
T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, K. Nakajima, M. Morikado, K. Inoh, T. Hamamoto, A. Nitayama: "Floating Body RAM Technology and its Scalability to 32nm Node and Beyond," IEEE IEDM (2006).
E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.
J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.
N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.
H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7pp).
E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.
F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007)
Initial Patent Examination Report from PCT/JP2021/014601, dated Apr. 6, 2021, 5 pgs.

* cited by examiner

FIG.2A  "1" Write State
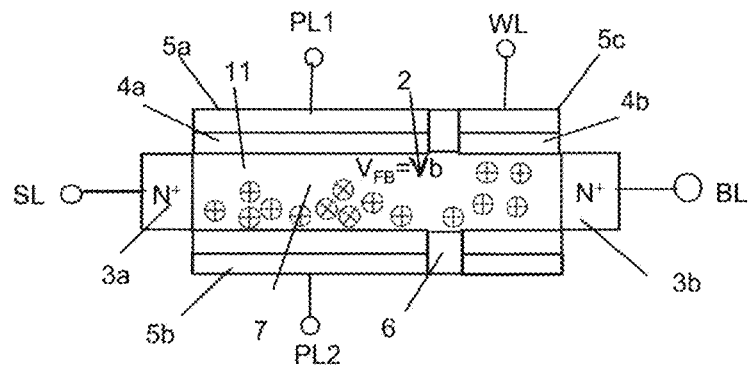
FIG.2B  "0" Erase Operation
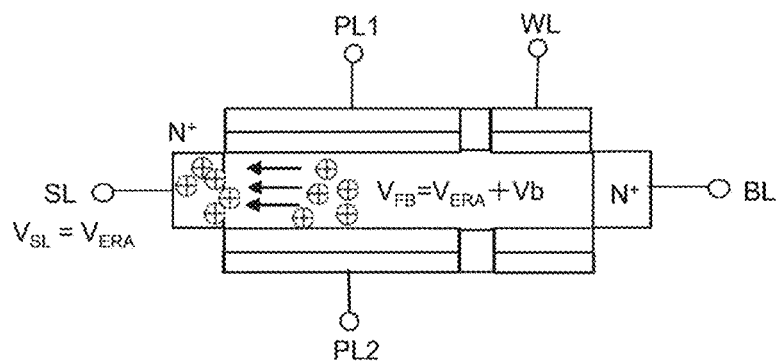
Vb: Built-in Voltage ~0.7V
Built-in Voltage ~0.7V
FIG.2C
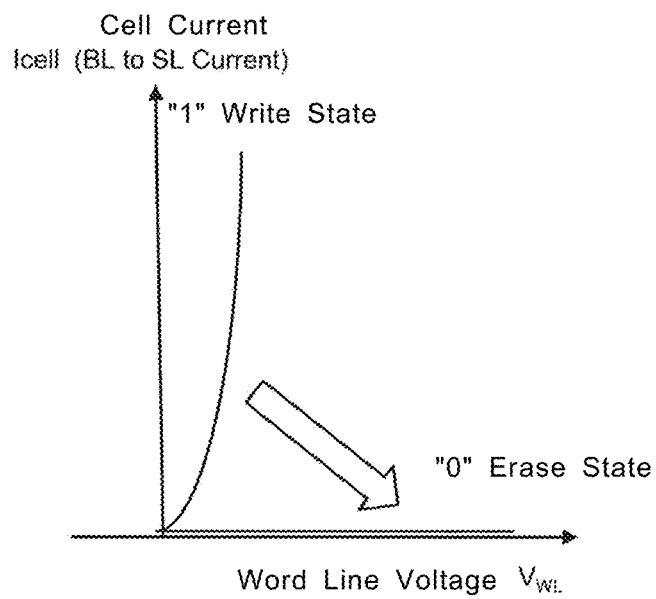

FIG.3A  "1" Write Operation
Source Side Impact Ionization
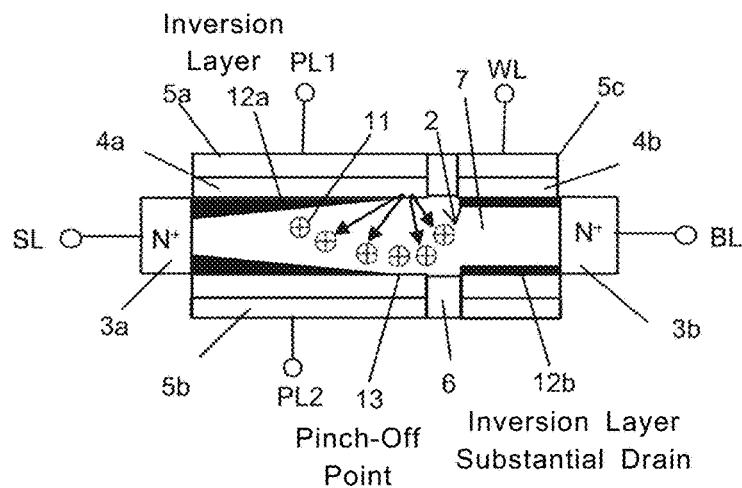
FIG.3B  "1" Write State
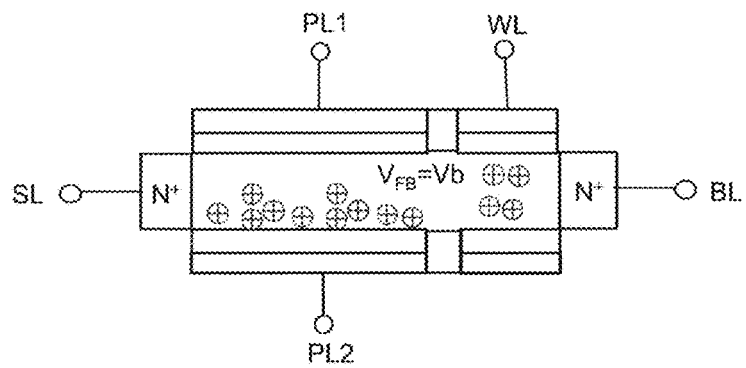
FIG.3C
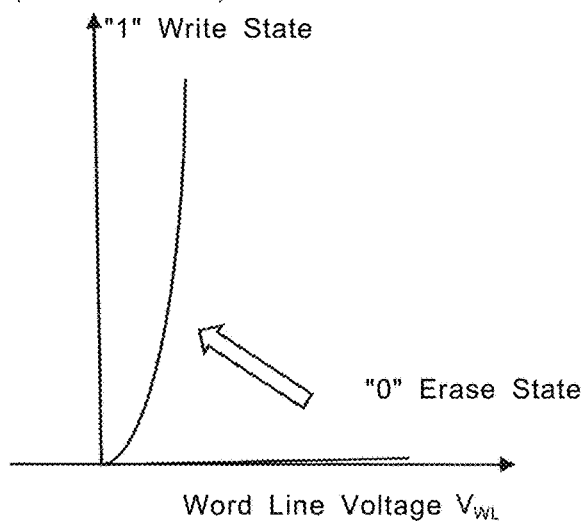

FIG.4AA  "1" Write State
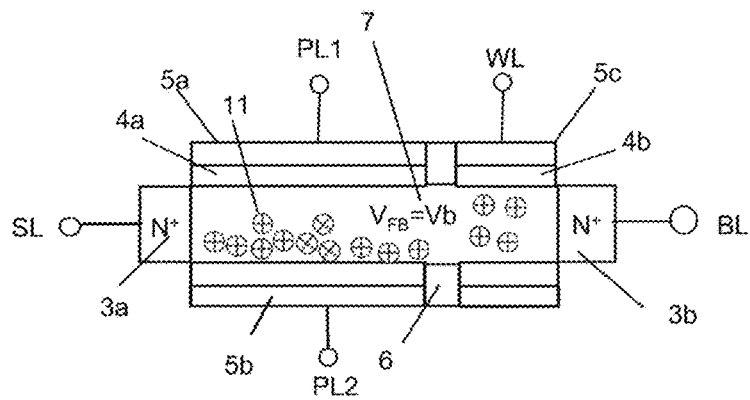
FIG.4AB  "0" Erase State
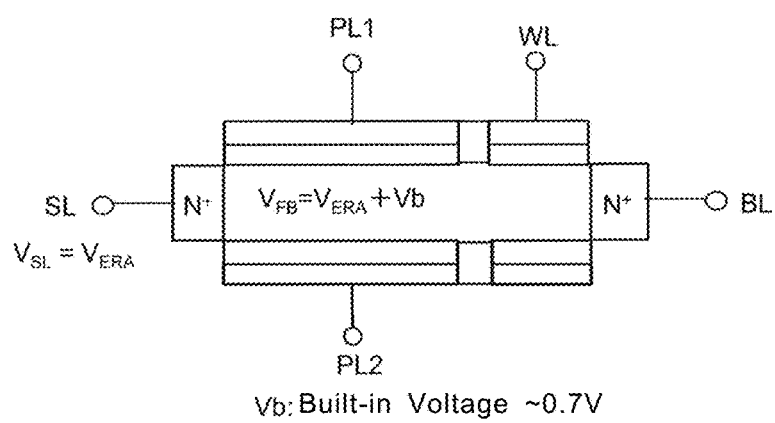
Vb: Built-in Voltage ~0.7V
FIG.4AC
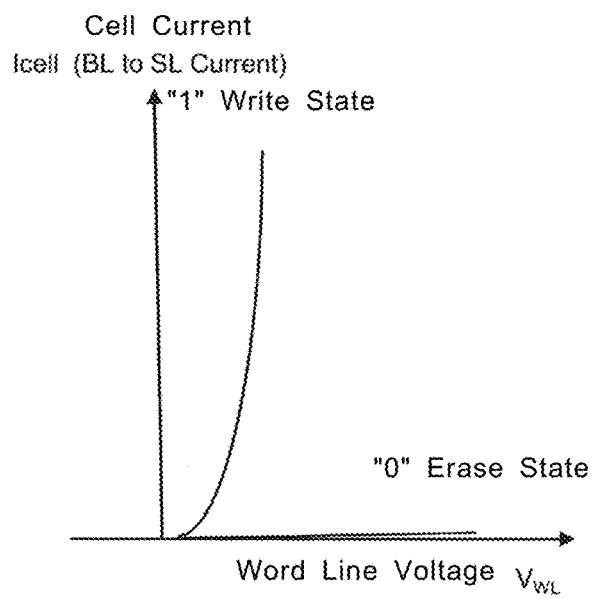

BL: Bit Line
SL: Source Line
WL: Word Line
PL1, PL2: Plate Lines
FB: Floating Body $C_{FB} = C_{PL} + C_{WL} + C_{BL} + C_{SL}$ $C_{PL} = C_{PL1} + C_{PL2}$ $\Delta V_{FB} = V_{FB2} - V_{FB1}$ $= \dfrac{C_{WL}}{C_{PL} + C_{WL} + C_{BL} + C_{SL}} \times V_{ReadWL}$ (4)

$$C_{FB} = C_{WL} + C_{BL} + C_{SL} \quad \text{Formula (1)}$$

$$\Delta V_{FB} = V_{FB2} - V_{FB1}$$

$$= \frac{C_{WL}}{C_{WL} + C_{BL} + C_{SL}} \times V_{ProgWL} \quad \text{Formula (2)}$$

$$\beta = \frac{C_{WL}}{C_{WL} + C_{BL} + C_{SL}} \quad \text{Formula (3)}$$

SGT MEMORY DEVICE WITH IMPROVED WRITE ERRORS

CROSS-REFERENCE TO RELATED APPLICATIONS

This application claims priority to PCT/JP2021/014601 filed Apr. 6, 2021, the enter content of which is incorporated herein by reference.

TECHNICAL FIELD

The present invention relates to a memory-element-including semiconductor device.

BACKGROUND ART

In recent years, in development of the LSI (Large Scale Integration) technology, there has been a demand for memory-element-including semiconductor devices having a higher degree of integration and higher performance.

In the ordinary planar MOS transistor, the channel extends, along the upper surface of the semiconductor substrate, in the horizontal direction. By contrast, the channel of the SGT extends in a direction perpendicular to the upper surface of the semiconductor substrate (refer to, for example, Patent Literature 1 and Non Patent Literature 1). For this reason, the SGT enables, compared with the planar MOS transistor, an increase in the density of the semiconductor device. Use of this SGT as a select transistor enables a higher degree of integration in, for example, a DRAM (Dynamic Random Access Memory, refer to, for example, Non Patent Literature 2) to which a capacitor is connected, a PCM (Phase Change Memory, refer to, for example, Non Patent Literature 3) to which a resistance change element is connected, an RRAM (Resistive Random Access Memory, refer to, for example, Non Patent Literature 4), and an MRAM (Magneto-resistive Random Access Memory, refer to, for example, Non Patent Literature 5) in which a current is used to change the orientation of the magnetic spin to change the resistance. In addition, there is a capacitor-less DRAM memory cell constituted by a single MOS transistor (refer to Non Patent Literature 6), for example. The present application relates to a semiconductor device including a dynamic flash memory that does not include resistance change elements or capacitors and can be constituted by a MOS transistor alone.

For the above-described capacitor-less DRAM memory cell constituted by a single MOS transistor, FIGS. 7A-7D illustrate the write operation, FIGS. 8A-8B illustrate a problem in the operation, and FIGS. 9A-9C illustrates the read operation (refer to Non Patent Literatures 6 to 10).

FIGS. 7A-7D illustrate the write operation of the DRAM memory cell. FIG. 7A illustrates the "1" write state. This memory cell is formed on an SOI substrate 101, and is constituted by a source N$^+$ layer 103 (hereafter, semiconductor regions containing donor impurities at high concentrations will be referred to as "N$^+$ layers") to which a source line SL is connected, a drain N$^+$ layer 104 to which a bit line BL is connected, a gate conductive layer 105 to which a word line WL is connected, and a floating body (Floating Body) 102 of a MOS transistor 110a; thus, the capacitor-less DRAM memory cell is constituted by the single MOS transistor 110a. Note that the floating body 102 is in contact with the immediately underlying layer, the SiO$_2$ layer 101 of the SOI substrate. In the memory cell constituted by the single MOS transistor 110a, in order to write "1", the MOS transistor 110a is operated in the saturation region. Specifically, an electron channel 107 extending from the source N$^+$ layer 103 has a pinch-off point 108 and does not reach the drain N$^+$ layer 104 to which the bit line is connected. Thus, when the MOS transistor 110a is operated such that the bit line BL connected to the drain N$^+$ layer 104 and the word line WL connected to the gate conductive layer 105 are set at high voltages, and the gate voltage is set at about ½ of the drain voltage, the electric field strength becomes maximum at the pinch-off point 108 near the drain N$^+$ layer 104. As a result, accelerated electrons flowing from the source N$^+$ layer 103 to the drain N$^+$ layer 104 collide with the Si lattice, and the kinetic energy lost at this time causes generation of electron-hole pairs. Most of the generated electrons (not shown) reach the drain N$^+$ layer 104. A very small portion of the electrons, very hot electrons jump over a gate oxide film 109, to reach the gate conductive layer 105. Holes 106 generated at the same time charge the floating body 102. In this case, the generated holes contribute, in the floating body 102 formed of P-type Si, as an increment of the majority carrier. When the floating body 102 is filled with the generated holes 106 and the voltage of the floating body 102 becomes higher than that of the source N$^+$ layer 103 by Vb or more, holes further generated are discharged to the source N$^+$ layer 103. Vb is the built-in voltage of the PN junction between the source N$^+$ layer 103 and the P-layer floating body 102, and is about 0.7 V. FIG. 7B illustrates a state in which the floating body 102 is charged to saturation with the holes 106 generated.

Hereinafter, with reference to FIG. 7C, the "0" write operation of the memory cell 110 will be described. For the common select word line WL, there are randomly a memory cell 110a to which "1" is written and a memory cell 110b to which "0" is written. FIG. 7C illustrates a state of a rewrite from a "1" write state to a "0" write state. In order to write "0", the voltage of the bit line BL is set to a negative bias and the PN junction between the drain N$^+$ layer 104 and the P-layer floating body 102 is forward biased. As a result, the holes 106 generated in advance in the floating body 102 in the previous cycle flow to the drain N$^+$ layer 104 connected to the bit line BL. Completion of the write operation provides two states of memory cells that are the memory cell 110a filled with the generated holes 106 (FIG. 7B) and the memory cell 110b from which the generated holes have been discharged (FIG. 7C). In the memory cell 110a filled with the holes 106, the floating body 102 has a higher potential than the floating body 102 not having generated holes. Thus, the threshold voltage of the memory cell 110a becomes lower than the threshold voltage of the memory cell 110b. This state is illustrated in FIG. 7D.

Hereinafter, a problem in the operation of the memory cell constituted by a single MOS transistor will be described with reference to FIGS. 8A-8B. As illustrated in FIG. 8A, the capacitance $C_{FB}$ of the floating body 102 is the sum of the capacitance $C_{WL}$ between the gate to which the word line is connected and the floating body 102, the junction capacitance $C_{SL}$ of the PN junction between the source N$^+$ layer 103 to which the source line is connected and the floating body 102, and the junction capacitance $C_{BL}$ of the PN junction between the drain N$^+$ layer 103 to which the bit line is connected and the floating body 102, and is expressed as follows.

$$C_{FB} = C_{WL} + C_{BL} + C_{SL} \qquad (1)$$

Thus, a change in the word line voltage $V_{WL}$ at the time of writing affects the voltage of the floating body 102 serving as the storage node (contact point) of the memory cell. This state is illustrated in FIG. 8B. At the time of writing, an increase in the word line voltage $V_{WL}$ from 0 V to $V_{ProgWL}$ results in an increase in the voltage $V_{FB}$ of the floating body 102 from the initial voltage $V_{FB1}$ of the original word line voltage to $V_{FB2}$ due to capacitive coupling with the word line. The voltage change amount $\Delta V_{FB}$ is expressed as follows:

$$\Delta V_{FB} = V_{FB2} - V_{FB1} \qquad (2)$$
$$= C_{WL} / (C_{WL} + C_{BL} + C_{SL}) \times V_{ProgWL}$$

where $$\beta = C_{WL} / (C_{WL} + C_{BL} + C_{SL}) \qquad (3)$$

is expressed and β is referred to as a coupling ratio. In such a memory cell, $C_{WL}$ has a high contribution ratio and, for example, $C_{WL}:C_{BL}:C_{SL}$=8:1:1. In this case, β=0.8. When the word line changes, for example, from 5 V at the time of writing to 0 V at the end of writing, the capacitive coupling between the word line and the floating body 102 causes an amplitude noise as much as 5V×β=4 V on the floating body 102. Thus, the potential difference margin is not sufficiently provided between the "1" potential and the "0" potential of the floating body at the time of writing, which is a problem.

FIGS. 9A-9C illustrate the read operation. FIG. 9A illustrates the "1" write state, and FIG. 9B illustrates the "0" write state. However, actually, even when "1" is written to write Vb in the floating body 102, returning of the word line to 0 V upon completion of writing brings the floating body 102 to a negative bias. When "0" is written, lowering to a further negative bias is caused, so that, at the time of writing, the potential difference margin between "1" and "0" cannot be made sufficiently large. This small operation margin is a major problem of the DRAM memory cell. In addition, formation of a peripheral circuit for driving the DRAM memory cell, on the same substrate, needs to be achieved.

There is a Twin-Transistor memory element in which, in an SOI (Silicon on Insulator) layer, two MOS transistors are used to form a single memory cell (refer to, for example, Patent Literatures 4 and 5). In such an element, an N+ layer separating the floating body channels of the two MOS transistors and serving as the source or the drain is formed in contact with an insulating layer. This N+ layer is in contact with the insulating layer to thereby provide electric isolation between the floating body channels of the two MOS transistors. The hole group serving as signal charges is stored in the floating body channel of one of the transistors. As described above, the voltage of the floating body channel in which holes are stored considerably varies due to application of a pulse voltage to the gate electrode of the adjacent MOS transistor, as expressed in Formula (2). Thus, as has been described with reference to FIGS. 7A-7D to FIG. 9A-9C, the operation margin between "1" and "0" at the time of writing cannot be made sufficiently large (refer to, for example, Non Patent Literature 15 and FIGS. 8A-8B).

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774
[PTL 4] US2008/0137394 A1
[PTL 5] US2003/0111681 A1

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[NPL 7] J. Wan, L. Rojer, A. Zaslaysky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[NPL 8] T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp 1510-1522 (2002).
[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[NPL 10] E. Yoshida: "A Capacitorless 1T-DRAM Technology Using Gate-Induced Drain-Leakage (GIDL) Current for Low-Power and High-Speed Embedded Memory," IEEE IEDM (2006).
[NPL 11] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.
[NPL 12] J. Y. Song, W. Y. Choi, J. H. Park, J. D. Lee, and B-G. Park: "Design Optimization of Gate-All-Around (GAA) MOSFETs," IEEE Trans. Electron Devices, vol. 5, no. 3, pp. 186-191, May 2006.
[NPL 13] N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017.
[NPL 14] H. Jiang, N. Xu, B. Chen, L. Zengl, Y. He, G. Du, X. Liu and X. Zhang: "Experimental investigation of self heating effect (SHE) in multiple-fin SOI FinFETs," Semicond. Sci. Technol. 29 (2014) 115021 (7pp).

[NPL 15] F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp. 765-771 (2007)

SUMMARY OF INVENTION

Technical Problem

In an SGT-including memory device that is a capacitor-less single-transistor DRAM (gain cell), capacitive coupling between the word line and the floating-state SGT body is strong; at the time of reading or writing of data, a change in the potential of the word line is transmitted directly as noise to the SGT body, which has been problematic. This causes problems of erroneous reading or erroneous writing of storage data and makes it difficult to put the capacitor-less single-transistor DRAM (gain cell) into practical use. The above-described problems need to be addressed and, on the substrate of the memory cell, a peripheral circuit for driving the memory cell also needs to be formed at a high density and at low costs.

Solution to Problem

In order to address such problems, a memory device according to the present invention includes a first semiconductor base extending, relative to a substrate, in a perpendicular direction or a horizontal direction;

a first impurity layer and a second impurity layer connecting to both ends of the first semiconductor base;

a first gate insulating layer disposed closer to the first impurity layer and surrounding a portion the first semiconductor base;

a second gate insulating layer disposed closer to the second impurity layer and surrounding the first semiconductor base between the first gate insulating layer and the second impurity layer;

a first gate conductor layer surrounding, in horizontal sectional view of the first semiconductor base, a first region in an outer periphery of the first gate insulating layer;

a second gate conductor layer, in horizontal sectional view, isolated from the first gate conductor layer and surrounding a second region, which is different from the first region, in the outer periphery of the first gate insulating layer;

a third gate conductor layer surrounding the second gate insulating layer; and a first insulating layer disposed between the first gate conductor layer and the third gate conductor layer and between the second gate conductor layer and the third gate conductor layer, wherein the first impurity layer, the second impurity layer, the first gate conductor layer, the second gate conductor layer, and the third gate conductor layer are disposed such that voltages applied to the first impurity layer, the second impurity layer, the first gate conductor layer, the second gate conductor layer, and the third gate conductor layer are controlled to perform a memory write operation, a memory read operation, and a memory erase operation (first invention).

In the first invention, the memory device is configured to perform an operation of applying, to the second gate conductor layer, a lower voltage than in the first gate conductor layer to store the hole group generated due to the impact ionization phenomenon or the gate induced drain leakage current, in the first semiconductor base closer to the second gate conductor layer (second invention).

In the first invention, a wiring line connected to one of the first impurity layer and the second impurity layer is a source line, a wiring line connected to another of the first impurity layer and the second impurity layer is a bit line, a wiring line connecting to the first gate conductor layer is a first driving control line, a wiring line connecting to the second gate conductor layer is a second driving control line, and a wiring line connecting to the third gate conductor layer is a word line, and the memory device is configured to apply voltages to the source line, the bit line, the first driving control line, the second driving control line, and the word line to perform the memory erase operation and the memory write operation (third invention).

In the first invention, a first gate capacitance being a sum of a gate capacitance between the first gate conductor layer and the first semiconductor base and a gate capacitance between the second gate conductor layer and the first semiconductor base is higher than a second gate capacitance between the third gate conductor layer and the first semiconductor base (fourth invention).

In order to address such problems, a memory device according to the present invention includes at least first to fourth memory devices each including the memory device according to the first invention formed in a direction perpendicular to the substrate, the first and the second memory devices being disposed, in plan view, on a first straight line, the third memory device being disposed, in plan view, on a second straight line parallel to the first straight line so as to be adjacent to the first memory device, the fourth memory device being disposed on the second straight line so as to be adjacent to the third memory device and the second memory device;

a fourth gate conductor layer connecting together the first gate conductor layer of the first memory device and the first gate conductor layer of the second memory device, and extending parallel to the first straight line;

a fifth gate conductor layer connecting together the second gate conductor layer of the first memory device and the second gate conductor layer of the second memory device, and extending parallel to the first straight line;

a sixth gate conductor layer connecting together the first gate conductor layer of the third memory device and the first gate conductor layer of the fourth memory device, and extending parallel to the first straight line;

a seventh gate conductor layer connecting together the second gate conductor layer of the third memory device and the second gate conductor layer of the fourth memory device, and extending parallel to the first straight line;

an eighth gate conductor layer connecting together the third gate conductor layer of the first memory device and the third gate conductor layer of the second memory device, and extending parallel to the first straight line; and a ninth gate conductor layer connecting together the third gate conductor layer of the third memory device and the third gate conductor layer of the fourth memory device, and extending parallel to the first straight line (fifth invention).

In the fifth invention, driving voltages supplied to the fourth gate conductor layer and the sixth gate conductor layer synchronize with a driving voltage supplied to the first gate conductor layer, and driving voltages supplied to the fifth gate conductor layer and the seventh gate conductor layer synchronize with a driving voltage supplied to the second gate conductor layer (sixth invention).

In the fifth invention, the fifth gate conductor layer and the sixth gate conductor layer connect to each other to form a tenth gate conductor layer, and the fourth gate conductor layer and the seventh gate conductor layer synchronize with a driving voltage supplied to the first gate conductor layer, and the tenth gate conductor layer synchronizes with a driving voltage supplied to the second gate conductor layer (seventh invention).

In the first invention, the first gate conductor layer includes a first conductor layer covering the first region of the first gate insulating layer and a first wiring conductor layer covering the first conductor layer, and the second gate conductor layer includes a second conductor layer covering the second region of the first gate insulating layer and a second wiring conductor layer covering the second conductor layer (eighth invention).

In the fifth invention, the third gate conductor layer includes a third conductor layer covering the second gate insulating layer and a third wiring conductor layer covering the third conductor layer (ninth invention).

In the first invention, the first impurity layer, the second impurity layer, the first gate conductor layer, the second gate conductor layer, and the third gate conductor layer are disposed such that voltages applied to the first impurity layer, the second impurity layer, the first gate conductor layer, the second gate conductor layer, and the third gate conductor layer are controlled to perform the memory write operation of discharging, of an electron group and a hole group generated within the first semiconductor base due to an impact ionization phenomenon caused by a current flowing between the first impurity layer and the second impurity layer or a gate induced drain leakage current, the electron group from the first semiconductor base and causing a portion of or entirety of the hole group to remain within the first semiconductor base, and the memory erase operation of discharging, from the first semiconductor base, the remaining hole group of the hole group (tenth invention).

BRIEF DESCRIPTION OF DRAWINGS

FIGS. 2A, 2B and 2C are explanatory views of the erase operation mechanism of a dynamic flash memory device according to a first embodiment.

FIGS. 3A, 3B and 3C are explanatory views of the write operation mechanism of a dynamic flash memory device according to a first embodiment.

FIGS. 4AA, 4AB and 4AC are explanatory views of the read operation mechanism of a dynamic flash memory device according to a first embodiment.

DESCRIPTION OF EMBODIMENTS

Hereinafter, a memory device using a semiconductor element (hereafter, referred to as a dynamic flash memory) according to embodiments of the present invention will be described in terms of structures and operations with reference to drawings.

First Embodiment

Figure 1A:
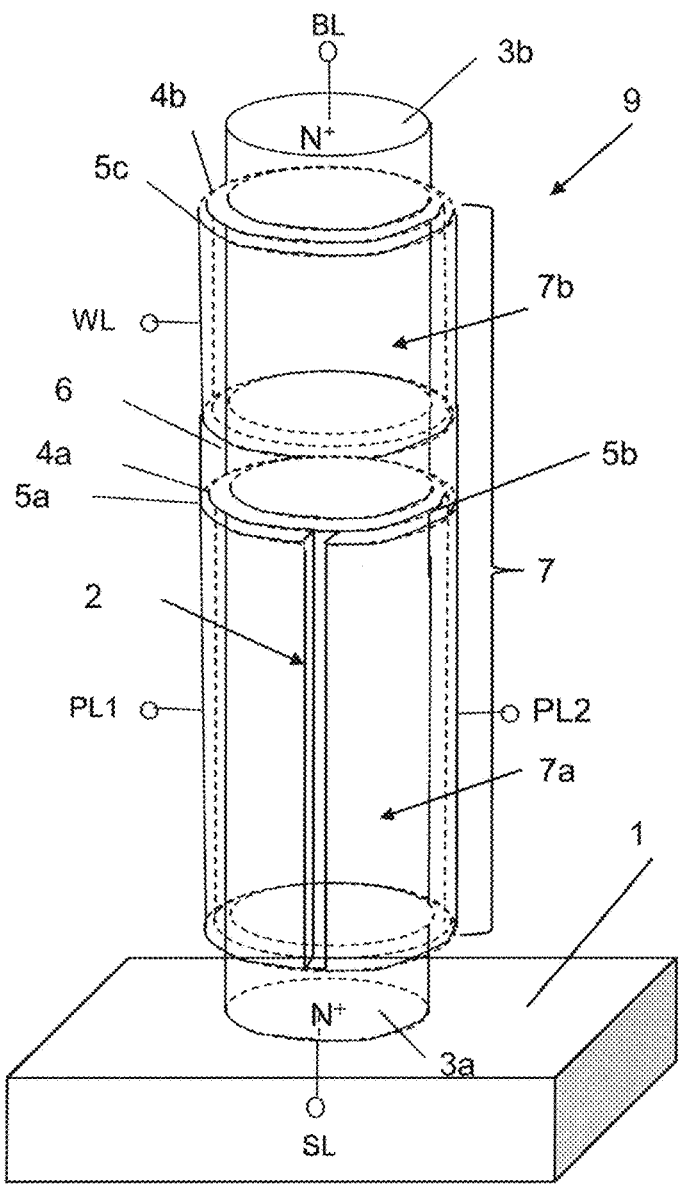
FIGS. 1A and 1B illustrate the structure of a dynamic flash memory device according to a first embodiment.
Figure 1B:
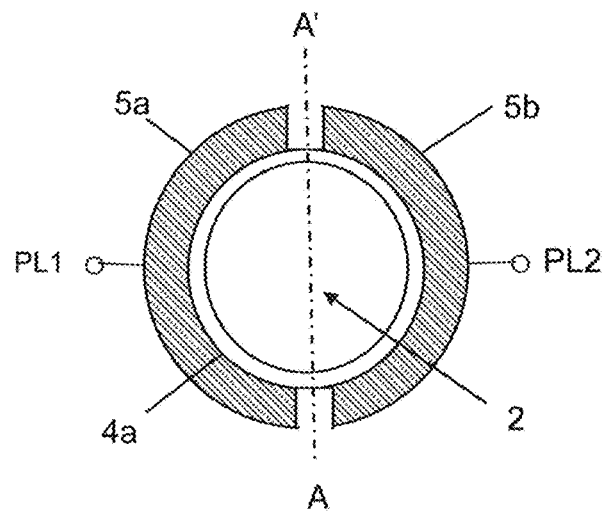
Figure 4B:
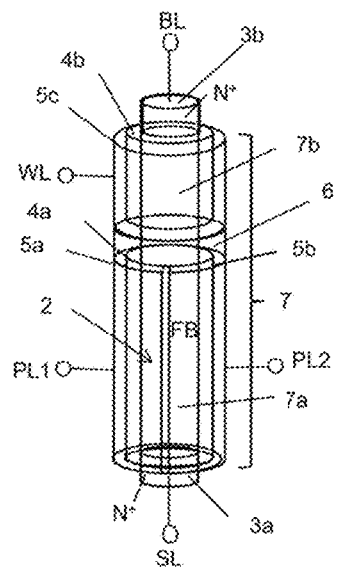
FIGS. 4BD, 4BE, 4BF and 4BG are explanatory views of the read operation mechanism of a dynamic flash memory device according to a first embodiment.
Figure 4B:
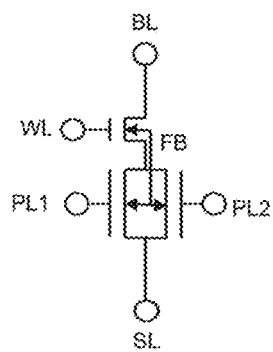
Figure 4B:
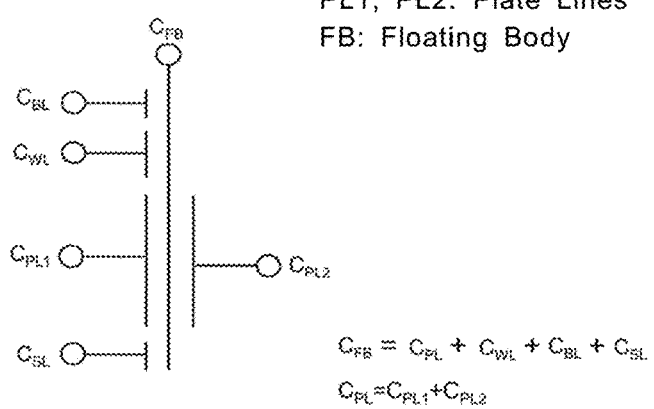
Figure 4B:
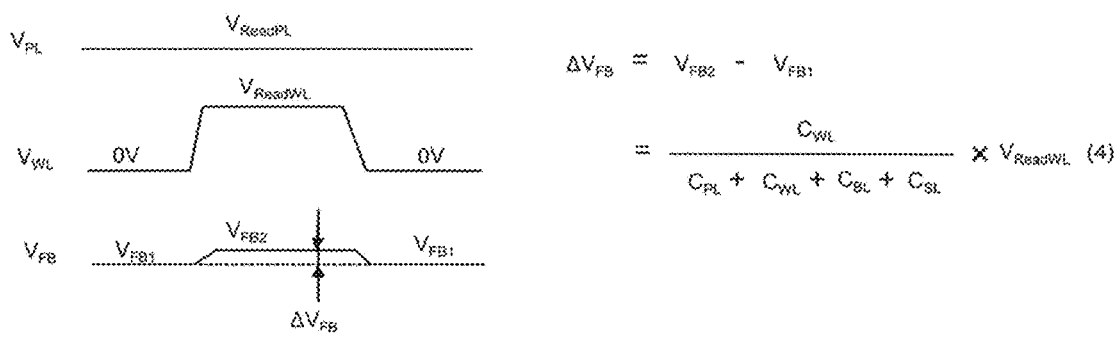

FIGS. 1A-1B to FIGS. 4BD-4BG will be used to describe a dynamic flash memory cell according to a first embodiment of the present invention in terms of structure and operation mechanisms. FIGS. 1A and 1B will be used to describe the structure of the dynamic flash memory cell. Subsequently, FIGS. 2A-2C will be used to describe the data erase mechanism; FIGS. 3A-3C will be used to describe the data write mechanism; FIGS. 4AA-4BG will be used to describe the data read mechanism.

FIGS. 1A and 1B illustrates the structure of a dynamic flash memory cell according to the first embodiment of the present invention; A is a perspective view and B is a horizontal sectional view of portions of first and second gate conductor layers 5a and 5b described later. As illustrated in FIG. 1A, on a substrate 1 (serving as an example of "substrate" in CLAIMS), a P-type or i-type (intrinsic type) conductivity type silicon pillar 2 (serving as an example of "first semiconductor pillar" in claims (hereafter, silicon pillars will be referred to as "Si pillars"), an $N^+$ layer 3a (serving as an example of "first impurity layer" in CLAIMS) connecting to the bottom portion of the Si pillar 2, and an $N^+$ layer 3b (serving as an example of "second impurity layer" in CLAIMS) connecting to the top portion of the Si pillar 2 are formed. One of the $N^+$ layer 3a and the $N^+$ layer 3b serves as the source while the other serves as the drain. In the Si pillar 2, the region between the $N^+$ layer 3a and the $N^+$ layer 3b serves as a channel region 7. A first gate insulating layer 4a (serving as an example of "first gate insulating layer" in CLAIMS) surrounding the lower portion of the Si pillar 2, and a second gate insulating layer 4b (serving as an example of "second gate insulating layer" in CLAIMS) surrounding the upper portion of the Si pillar 2 are formed. These first gate insulating layer 4a and the second gate insulating layer 4b are respectively disposed in contact with or near the $N^+$ layers 3a and 3b serving as the source and the drain. A first gate conductor layer 5a (serving as an example of "first gate conductor layer" in CLAIMS) and a second gate conductor layer 5b (serving as an example of "second gate conductor layer" in CLAIMS) surround the first gate insulating layer 4a. As illustrated in FIG. 1B, the first gate conductor layer 5a and the second gate conductor layer 5b are formed so as to surround the first gate insulating layer 4a and be isolated from each other. A third gate conductor layer 5c (serving as an example of "third gate conductor layer" in CLAIMS) surrounding the second gate insulating layer 4b is formed. The first gate conductor layer 5a and the third gate conductor layer 5c, and the second gate conductor layer 5b and the third gate conductor layer 5c are isolated from each other by an insulating layer 6 (serving as an example of "first insulating layer" in CLAIMS). The channel region 7 is constituted by a first channel region 7a surrounded by the first gate insulating layer 4a and a second channel region 7b surrounded by the second gate insulating layer 4b. Thus, the N$^+$ layers 3a and 3b serving as the source and the drain, the channel region 7, the first gate insulating layer 4a, the second gate insulating layer 4b, the first gate conductor layer 5a, the second gate conductor layer 5b, and the third gate conductor layer 5c form a dynamic flash memory cell 9. The N$^+$ layer 3a is connected to a source line SL (serving as an example of "source line" in CLAIMS); the N$^+$ layer 3b is connected to a bit line BL (serving as an example of "bit line" in CLAIMS); the first gate conductor layer 5a is connected to a first plate line PL1 (serving as an example of "first driving control line" in CLAIMS); the second gate conductor layer 5b is connected to a second plate line PL2 (serving as an example of "second driving control line" in CLAIMS); the third gate conductor layer 5c is connected to a word line WL (serving as an example of "word line" in CLAIMS).

Note that the dynamic flash memory cell may be horizontal relative to the substrate 1. In this case, in FIG. 1B, line A-A' drawn to pass through the gaps at both ends of the first gate conductor layer 5a and the second gate conductor layer 5b may be parallel to or perpendicular to the substrate 1. The substrate 1 may be formed as SOI (Silicon On Insulator) or a monolayer or multilayers of Si or another semiconductor material. The substrate 1 may be a well layer constituted by a monolayer or multilayers of N layers or P layers. In FIG. 1B, lengths in the circumferential directions (circumferential lengths) of the first gate conductor layer 5a and the second gate conductor layer 5b surrounding the first gate insulating layer 4a may be the same or the circumferential lengths may be different from each other.

Referring to FIGS. 2A-2C, the erase operation mechanism will be described. The channel region 7 between the N$^+$ layers 3a and 3b is electrically isolated from the substrate to serve as a floating body. FIG. 2A illustrates a state in which, prior to the erase operation, a hole group 11 generated by impact ionization in the previous cycle is stored in the channel region 7. In this case, the voltage of the second PL line PL2 is set to be lower than the voltage of the first PL line PL1, so that the hole group 11 is stored in the channel region 7 being closer to the second gate conductor layer connecting to the PL line PL2. As illustrated in FIG. 2B, at the time of the erase operation, the voltage of the source line SL is set to a negative voltage $V_{ERA}$. $V_{ERA}$ is, for example, −3 V. As a result, irrespective of the initial potential value of the channel region 7, the PN junction between the N$^+$ layer 3a to which the source line SL is connected and which serves as the source and the channel region 7 is forward biased. As a result, the hole group 11 generated in the previous cycle by impact ionization and stored in the channel region 7 is drawn into the N$^+$ layer 3a serving as the source region, and the potential $V_{FB}$ of the channel region 7 becomes $V_{FB}=V_{ERA}+$ Vb where Vb is the built-in voltage of the PN junction and is about 0.7 V. Thus, when $V_{ERA}=−3$ V, the potential of the channel region 7 becomes −2.3 V. This value corresponds to the potential state of the channel region 7 in an erase state. Thus, when the potential of the channel region 7 of the floating body becomes a negative voltage, the threshold voltage of the N channel MOS transistor of the dynamic flash memory cell 9 increases due to the substrate bias effect. This results in, as illustrated in FIG. 2C, an increase in the threshold voltage of the second gate conductor layer 5b to which the word line WL is connected. This erase state of the channel region 7 is assigned to logical storage data "0". Note that, in data reading, the voltage applied to the first gate conductor layer 5a connecting to the plate line PL1 is set to be higher than the threshold voltage at the time of logical storage data "1" and to be lower than the threshold voltage at the time of logical storage data "0", to thereby provide, as illustrated in FIG. 2C, a property in which, in reading of logical storage data "0", in spite of setting the word line WL to a high voltage, no current flows. The conditions of voltages applied to the bit line BL, the source line SL, the word line WL, and the plate lines PL1 and PL2 are an example for performing the erase operation; other operation conditions for performing the erase operation may be employed. For example, a voltage difference may be applied between the bit line BL and the source line SL to cause a current to flow in the channel region 7 and electron-hole recombination occurring at this time may be used to perform the erase operation.

FIGS. 3A-3C illustrates the write operation of the dynamic flash memory cell according to the first embodiment of the present invention. As illustrated in FIG. 3A, for example, 0 V is applied to the N$^+$ layer 3a to which the source line SL is connected; for example, 3 V is applied to the N$^+$ layer 3b to which the bit line BL is connected; for example, 2 V is applied to the first gate conductor layer 5a and the second gate conductor layer 5b to which the plate lines PL1 and PL2 are connected; for example, 5 V is applied to the third gate conductor layer 5c to which the word line WL is connected. As a result, as illustrated in FIG. 3A, in the inner region relative to the first gate conductor layer 5a to which the plate line PL1 is connected and the second gate conductor layer 5b to which the plate line PL2 is connected, an inversion layer 12a is formed; the first N channel MOS transistor region including the channel region 7a surrounded by the first gate conductor layer 5a and the second gate conductor layer 5b is operated in the saturation region. This results in, in the inversion layer 12a in the inner region relative to the first gate conductor layer 5a and the second gate conductor layer 5b to which the plate lines PL1 and PL2 are connected, the presence of a pinch-off point 13. On the other hand, a second N channel MOS transistor region including the channel region 7b surrounded by the third gate conductor layer 5c to which the word line WL is connected is operated in the linear region. This results in, in the inner region relative to the third gate conductor layer 5c to which the word line WL is connected, without the presence of the pinch-off point, formation of an inversion layer 12b over the entire surface. The inversion layer 12b formed over the entire surface in the inner region relative to the third gate conductor layer 5c to which the word line WL is connected serves as substantially the drain of the first N channel MOS transistor region including the first gate conductor layer 5a and the second gate conductor layer 5b. As a result, the electric field becomes maximum in the boundary region of the channel region 7 (first boundary region) between the first N channel MOS transistor including the first gate conductor layer 5a and the second gate conductor layer 5b and the second N channel MOS transistor region including the third gate conductor layer 5c that are connected in series and, in this region, an impact ionization phenomenon is caused. This region is a source-side region when viewed from the second N channel MOS transistor region including the third gate conductor layer 5c to which the word line WL is connected, and hence this phenomenon will be referred to as a source-side impact ionization phenomenon. This source-side impact ionization phenomenon causes electrons to flow from the N$^+$ layer 3a to which the source line SL is connected to the N$^+$ layer 3b to which the bit line is connected. Accelerated electrons collide with lattice Si atoms, and the kinetic energy causes generation of electron-hole pairs. Most of the generated electrons flow to the N+ layer 3b to which the bit line BL is connected. In writing of "1", Gate Induced Drain Leakage (GIDL: Gate Induced Drain Leakage) current may be used to generate electron-hole pairs (refer to NPL 11), to cause the generated hole group to fill the floating body FB.

As illustrated in FIG. 3B, the generated hole group 11 is the majority carrier of the channel region 7 and charges the channel region 7 to a positive bias. The N+ layer 3a to which the source line SL is connected is at 0 V, and hence the channel region 7 is charged to the built-in voltage Vb (about 0.7 V) of the PN junction between the N+ layer 3a to which the source line SL is connected and the channel region 7. When the channel region 7 is charged to a positive bias, the threshold voltages of the first N channel MOS transistor region and the second N channel MOS transistor region decrease due to the substrate bias effect. This results in, as illustrated in FIG. 3C, a decrease in the threshold voltage of the N channel MOS transistor of the second channel region 7b to which the word line WL is connected. This write state of the channel region 7 is assigned to logical storage data "1".

Note that, at the time of the write operation, instead of the first boundary region, at the second boundary region between the first impurity layer and the first channel semiconductor layer or at the third boundary region between the second impurity layer and the second channel semiconductor layer, the impact ionization phenomenon or GIDL current may be caused to generate electron-hole pairs, to cause the generated hole group 11 to charge the channel region 7. Note that a voltage may be applied to the first gate conductor layer 5a to operate in the saturation region while voltages may be applied to the second gate conductor layer 5b and the third gate conductor layer 5c to operate in the linear region. In this case, the impact ionization phenomenon is caused in the surface layer of the channel region 7 closer to the first gate conductor layer 5a. A bipolar operation may be carried out to perform the write operation. The conditions of voltages applied to the bit line BL, the source line SL, the word line WL, and the plate lines PL1 and PL2 are an example for performing the write operation; other operation conditions for performing the write operation may be employed.

Referring to FIGS. 4AA-4AC and FIGS. 4BD-4BG, the dynamic flash memory cell according to the first embodiment of the present invention will be described in terms of its read operation and its related memory cell structure. Referring to FIG. 4AA to FIG. 4AC, the read operation of the dynamic flash memory cell will be described. As illustrated in FIG. 4AA, charging of the channel region 7 to the built-in voltage Vb (about 0.7 V) results in a decrease in the threshold voltage of the N channel MOS transistor due to the substrate bias effect. This state is assigned to logical storage data "1". As illustrated in FIG. 4AB, when the memory block selected prior to writing is in an erase state "0" in advance, the channel region 7 is at a floating voltage $V_{FB}$ equal to $V_{ERA}$+Vb. The write operation causes random storage of write state "1". This results in, for the word line WL, generation of logical storage data of logical "0" and "1". As illustrated in FIG. 4AC, the difference between the two threshold voltages for the word line WL is used to perform reading using a sense amplifier. Note that, in data reading, the voltage applied to the first gate conductor layer 5a connecting to the plate line PL1 is set to be higher than the threshold voltage at the time of logical storage data "1" and to be lower than the threshold voltage at the time of logical storage data "0", to thereby provide, as illustrated in FIG. 2C, a property in which, in reading of logical storage data "0", in spite of setting the word line WL to a high voltage, no current flows. In data reading, voltages applied to the plate lines PL1 and PL2 may be controlled to generate the read cell current from the surface layer channel of the channel region 7 sandwiched between the first gate conductor layer 5a and the second gate conductor layer 5b. This results in a large read cell current. In this case, in the logical "1" read operation, voltages applied to the bit line BL, the source line SL, the word line WL, and the plate lines PL1 and PL2 are desirably controlled to cause an impact ion phenomenon in the channel region 7, to write logical "1" again.

Referring to FIG. 4BD to FIG. 4BG, for the dynamic flash memory cell according to the first embodiment of the present invention, at the time of the read operation, the first gate conductor layer 5a, the second gate conductor layer 5b, and the third gate conductor layer 5c will be described in terms of the magnitude relation of the three gate capacitances and their related operations. The gate capacitance of the third gate conductor layer 5c to which word line WL connects is desirably designed to be lower than the sum of the gate capacitances of the first gate conductor layer 5a and the second gate conductor layer 5b to which the plate lines PL1 and PL2 connect. As illustrated in FIG. 4BD, the perpendicular lengths of the first gate conductor layer 5a and the second gate conductor layer 5b to which the plate lines PL1 and PL2 connect are made larger than the perpendicular length of the third gate conductor layer 5c to which the word line WL connects, to make the gate capacitance of the third gate conductor layer 5c to which the word line WL connects be lower than the sum of the gate capacitances of the first gate conductor layer 5a and the second gate conductor layer 5b to which the plate lines PL1 and PL2 connect. FIG. 4BE illustrates the equivalent circuit of the single cell of the dynamic flash memory in FIG. 4BD. FIG. 4BF illustrates the coupling capacitance relation of the dynamic flash memory where $C_{WL}$ is the capacitance of the third gate conductor layer 5c, $C_{PL}$ is the sum of the capacitance $C_{PL1}$ of the first gate conductor layer 5a and the capacitance $C_{PL2}$ of the second gate conductor layer 5b, $C_{BL}$ is the capacitance of the PN junction between the N+ layer 3b serving as the drain and the second channel region 7b, and $C_{SL}$ is the capacitance of the PN junction between the N+ layer 3a serving as the source and the first channel region 7a. As illustrated in FIG. 4BG, when the voltage of the word line WL changes, its operation affects, as noise, the channel region 7. At this time, the potential change $\Delta V_{FB}$ of the channel region 7 is expressed as follows.

$$\Delta V_{FB} = C_{WL}/(C_{PL}+C_{WL}+C_{BL}+C_{SL}) \times V_{ReadWL} \quad (4)$$

where $V_{ReadWL}$ is the changing potential of the word line WL at the time of reading. As is clear from Formula (4), relative to the total capacitance $C_{BL}+C_{WL}+C_{BL}+C_{SL}$ of the channel region 7, a decrease in the contribution ratio of $C_{WL}$ results in a decrease in $\Delta V_{FB}$. $C_{BL}+C_{SL}$ is the capacitance of the PN junction and can be increased by, for example, increasing the diameter of the Si pillar 2. However, this is not desirable for miniaturization of the memory cell. By contrast, the axial lengths of the first gate conductor layer 5a and the second gate conductor layer 5b connecting to the plate lines PL1 and PL2 can be made even larger than the axial length of the third gate conductor layer 5c to which the word line WL connects, to thereby achieve, without a decrease in the degree of integration of the memory cell in plan view, a further decrease in $\Delta V_{FB}$. Note that the conditions of voltages applied to the bit line BL, the source line SL, the word line WL, and the plate lines PL1 and PL2 are an example for performing the read operation; other operation conditions for performing the read operation may be employed.

For FIGS. 1A and 1B, the SGT in which the first gate insulating layer 4a and the second gate insulating layer 4b are disposed so as to surround the whole side surface of the first Si pillar 2a standing, in the perpendicular direction, on the substrate 1, and the first gate conductor layer 5a, the second gate conductor layer 5b, and the third gate conductor layer 5c surround the entirety of the first gate insulating layer 4a and the second gate insulating layer 4b has been used as an example for describing the dynamic flash memory element. As has been described for this embodiment, the dynamic flash memory element at least has a structure satisfying conditions under which the hole group generated by the impact ionization phenomenon or the gate induced drain leakage current is held in the channel region 7. In order to achieve this, the channel region 7 has a floating body structure isolated from the substrate 1. In this case, even in the case of using, for example, one of SGT, the GAA (Gate All Around: for example, refer to NPL 12) technology and the Nanosheet technology (for example, refer to NPL 13) to form the semiconductor base of the channel region so as to extend horizontally relative to the substrate 1, the above-described dynamic flash memory operation can be performed. Alternatively, a device structure using SOI (Silicon On Insulator) may be employed. In this device structure, the bottom portion of the channel region is in contact with the insulating layer of the SOI substrate, and another channel region is surrounded by a gate insulating layer and an element-isolation insulating layer. Also, in this structure, the channel region has a floating body structure. Thus, the dynamic flash memory element provided by the embodiment at least satisfies the condition under which the channel region has a floating body structure. Even in the case of a structure in which a Fin transistor (for example, refer to NPL 14) is formed on an SOI substrate, as long as the channel region has a floating body structure, the dynamic flash operation can be performed.

In FIGS. 1A and 1B, the first gate conductor layer 5a connecting to the first plate line PL1 and the second gate conductor layer 5b connecting to the second plate line PL2 are disposed so as to be adjacent to the $N^+$ layer 3a connecting to the source line SL; alternatively, the third gate conductor layer 5c connecting to the word line WL may be disposed so as to be adjacent to the $N^+$ layer 3a and, the first gate conductor layer 5a and the second gate conductor layer 5b may be disposed so as to be adjacent to the $N^+$ layer 3b connecting to the bit line BL.

This embodiment provides the following features.
(Feature 1)

When the dynamic flash memory cell according to the first embodiment of the present invention performs the write or read operation, the voltage of the word line WL changes up and down. At this time, the first gate conductor layer 5a and the second gate conductor layer 5b connecting to the plate lines PL1 and PL2 play the role of reducing the capacitive coupling ratio between the word line WL and the channel region 7. As a result, during up-and-down changes in the voltage of the word line WL, the effect due to the changes in the voltage in the channel region 7 can be considerably suppressed. As a result, the difference between the threshold voltages of the SGT transistor for the word line WL indicating logical "0" and "1" can be made to be large. This leads to an increase in the operation margin of the dynamic flash memory cell. In data reading, the voltage applied to the first gate conductor layer 5a connecting to the plate line PL1 can be set to be higher than the threshold voltage at the time of logical storage data "1", and to be lower than the threshold voltage at the time of logical storage data "0", to thereby provide a property in which, in reading of logical storage data "0", in spite of setting the word line WL to a high voltage, no current flows. This leads to a further increase in the operation margin of the dynamic flash memory cell.
(Feature 2)

In the first embodiment according to the present invention, the first gate conductor layer 5a connecting to the plate line PL1 and the second gate conductor layer 5b connecting to the plate line PL2 are formed so as to surround the first gate insulating layer 4a and be isolated from each other. The voltage applied to the plate line PL2 is made to be lower than the voltage applied to the plate line PL1, so that the hole group is stored in the channel region 7a closer to the second gate conductor layer 5b connecting to the plate line PL2. This enables, compared with the structure in which the whole channel region 7a is surrounded by a single gate electrode, storage of the group of a large number of holes. In the read operation, the voltage applied to the second gate conductor layer 5b can be used to control the floating body voltage of the channel region 7a. This enables, in the read operation, more stably maintaining of the back bias effect. As a result, a dynamic flash memory cell having a broader operation margin is achieved.

Second Embodiment

Figure 5A:
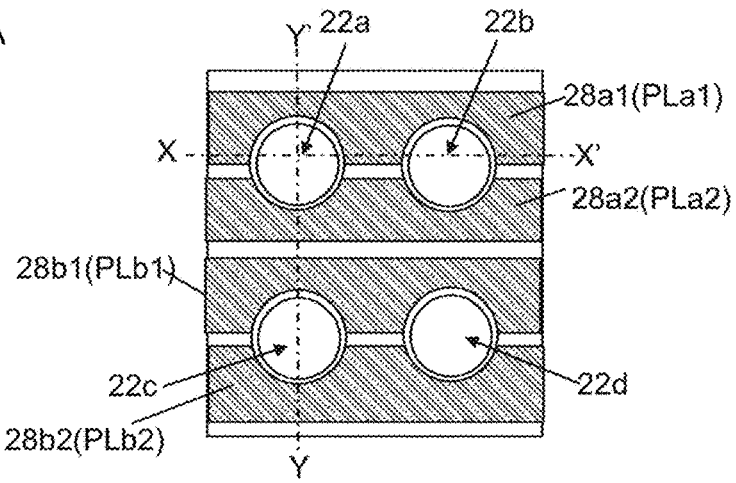
FIGS. 5A, 5B and 5C are explanatory views of the structures of a dynamic flash memory cell according to a second embodiment.
Figure 5B:
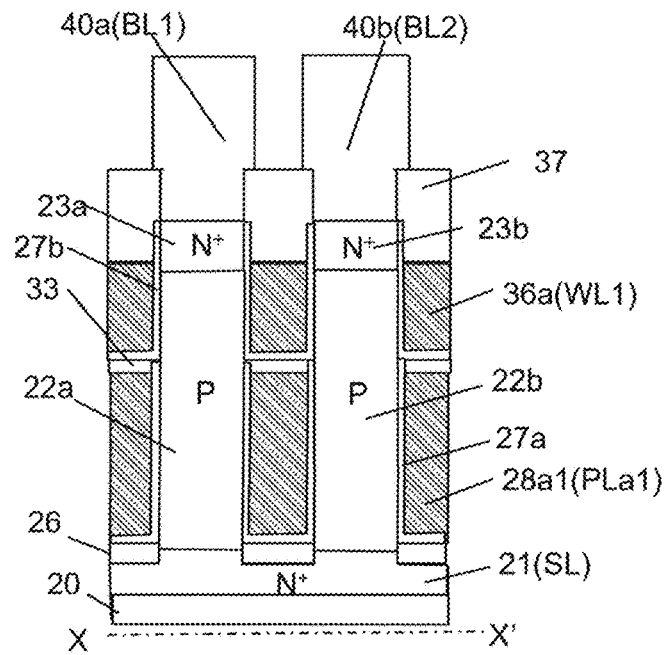
Figure 5C:
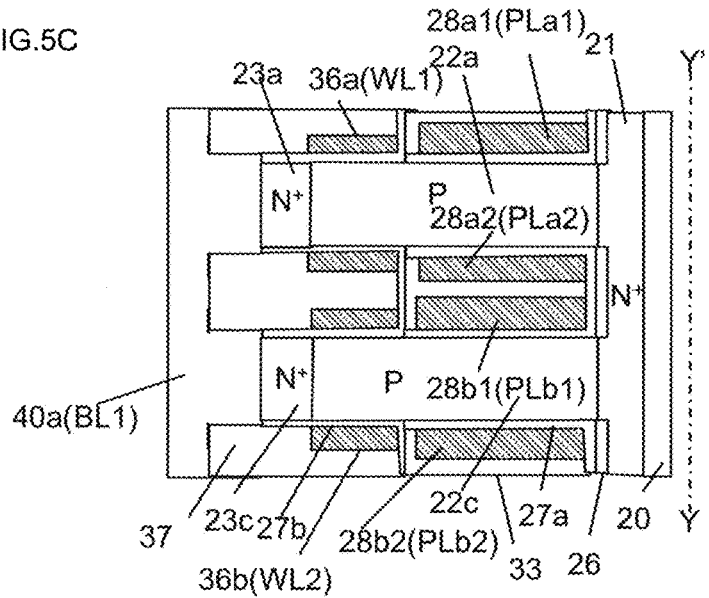

Referring to FIGS. 5A-5C, the structure of the memory cells of a dynamic flash memory according to a second embodiment will be described. FIG. 5A is a plan view extending across the first plate line conductor layer of the dynamic flash memory. FIG. 5B is a sectional view taken along line X-X' in FIG. 5A. FIG. 5C is a sectional view taken along line Y-Y' in FIG. 5A.

A P layer 20 (hereafter, semiconductor regions containing an acceptor impurity will be referred to as "P layers") and an $N^+$ layer 21 connecting to the P layer 20 are disposed. On the $N^+$ layer 21, Si pillars 22a, 22b, 22c, and 22d are disposed. In the top portions of the Si pillars 22a to 22d, $N^+$ layers 23a, 23b, 23c, and 23d (not shown) are disposed. On the $N^+$ layer 21 in the outer periphery portions around the Si pillars 22a to 22d, a $SiO_2$ layer 26 is disposed. A $HfO_2$ layer 27a is disposed so as to surround the lower side surfaces of the Si pillars 22a to 22d. TiN layers 28a1 and 28a2 are disposed so as to surround the side surface of the $HfO_2$ layer 27a, to be isolated from each other and connect to the side surfaces of the Si pillars 22a and 22b, and to extend in the direction of line X-X'; TiN layers 28b1 and 28b2 are disposed so as to be isolated from each other and connect to the side surfaces of the Si pillars 22c and 22d, and to extend in the direction of line X-X'. A $SiO_2$ layer 33 is disposed so as to cover the TiN layers 28a1, 28a2, 28b1, and 28b2. A $HfO_2$ layer 27b is disposed so as to surround the upper side surfaces of the Si pillars 22a to 24d, on the $SiO_2$ layer 33. A $SiO_2$ layer 37 is disposed so as to cover the whole structure. A wiring metal layer 40a is disposed so as to connect to the $N^+$ layers 23a and 23c; a wiring metal layer 40b is disposed so as to connect to the $N^+$ layers 23b and 23d.

In FIGS. 5A-5C, the $N^+$ layer 21 connects to the source line SL. The TiN layers 28a1 and 28b1 connect to the first plate lines PLa1 and PLb1; the TiN layers 28a2 and 28b2 connect to the second plate lines PLa2 and PLb2. The TiN layers 36a and 36b connect to the word lines WL1 and WL2. The $N^+$ layers 23a and 23c connect to the bit line BL1; the N+ layers 23b and 23d connect to the bit line BL2. As a result, on the substrate 20, a plurality of dynamic flash memory cells are formed.

Note that, for FIGS. 5A-5C, the example in which the TiN layers 28a1 and 28b1 connect to the first plate lines PLa1 and PLb1 and the TiN layers 28a2 and 28b2 connect to the second plate lines PLa2 and PLb2 has been described. Alternatively, the TiN layers 28a1 and 28b1 may connect to the second plate lines PLa2 and PLb2 and the TiN layers 28a2 and 28b2 may connect to the first plate lines PLa1 and PLb1. Even when the TiN layers 28a1 and 28b2 are connected to the first plate lines PLa1 and PLb1 and the TiN layers 28a2 and 28b2 are connected to the second plate lines PLa2 and PLb1, the TiN layers 28a1, 28a2, 28b1, and 28b2 can play the roles of the first gate conductor layer 5a and the second gate conductor layer 5b in FIGS. 1A and 1B.

For FIGS. 5A-5C, the example in which the TiN layers 28a1, 28a2, 28b1, and 28b2 are formed of a single TiN material has been described. Alternatively, the layers may be formed so as to include a conductor layer having the role of a gate conductor layer and a conductor layer having the role of a wiring conductor layer. These gate conductor layer and wiring conductor layer may be formed as monolayers or multilayers of materials. Similarly, the gate conductor layers 36a and 36b may be formed so as to include a conductor layer having the role of a gate conductor layer and a conductor layer having the role of a wiring conductor layer. These gate conductor layer and wiring conductor layer may be formed as monolayers or multilayers of materials.

This embodiment provides the following features.
(Feature 1)

In this embodiment, the TiN layer 28a1 connecting to the first plate line PLa1 and the TiN layer 28a2 connecting to the second plate line PLa2 are disposed so as to surround the outer periphery portions of the Si pillars 22a and 22b, to extend in the direction of line X-X', and to be isolated from each other. Similarly, the TiN layer 28b1 connecting to the first plate line PLb1 and the TiN layer 28b2 connecting to the second plate line PLb2 are disposed so as to surround the outer periphery portions of the Si pillars 22c and 22d, to extend in the direction of line X-X', and to be isolated from each other. The voltages applied to the second plate lines PLa2 and PLb2 can be made lower than the voltages applied to the first plate lines PLa1 and PLa2, to thereby store the hole group generated by impact ionization, in the Si pillars 22a to 22d closer to the second TiN layers 28a2 and 28b2. As a result, the amount of stored hole group can be made larger than that in the dynamic flash memory cells in which the whole outer periphery of the Si pillars 22a to 22d is surrounded by a plate line conductor layer. As a result, the operation margin of the dynamic flash memory cells can be increased.
(Feature 2)

For example, in the operation of applying pulse voltages to the word line WL1 and the plate line PLa1 to read the memory cell connecting to the word line WL1, the voltage applied to the plate line PLa2 can be fixed, to thereby suppress the potential change of the channel region 7, so that the operation margin of the dynamic flash memory cells can be increased.

Third Embodiment

Figure 6A:
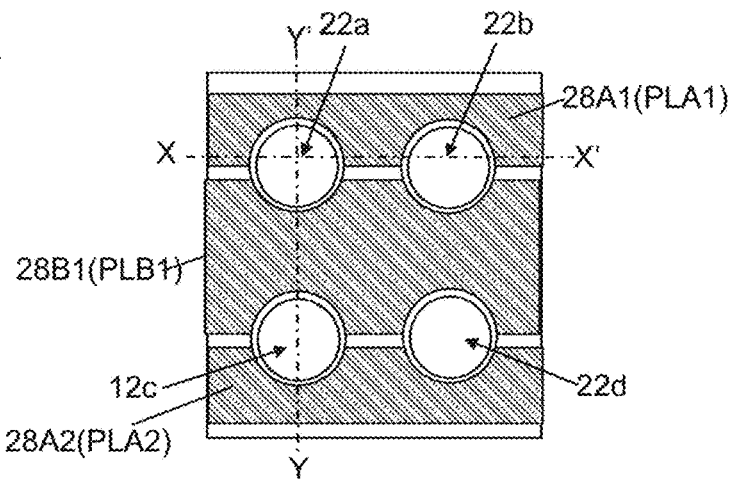
FIGS. 6A, 6B and 6C are explanatory views of the structures of a dynamic flash memory cell according to a third embodiment.
Figure 6B:
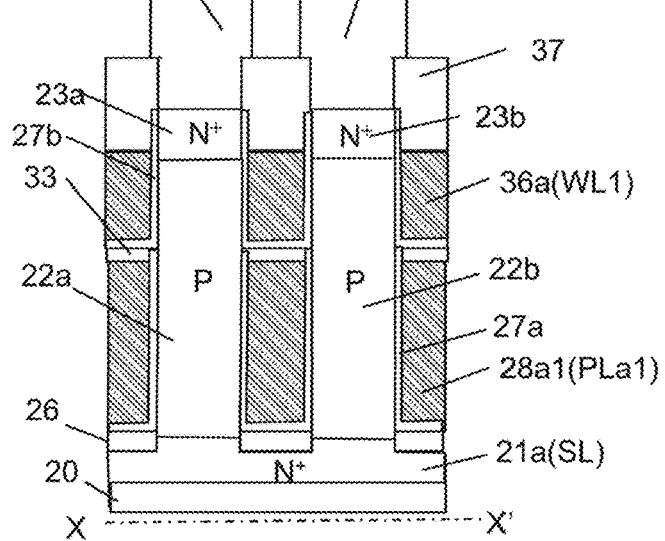
Figure 6C:
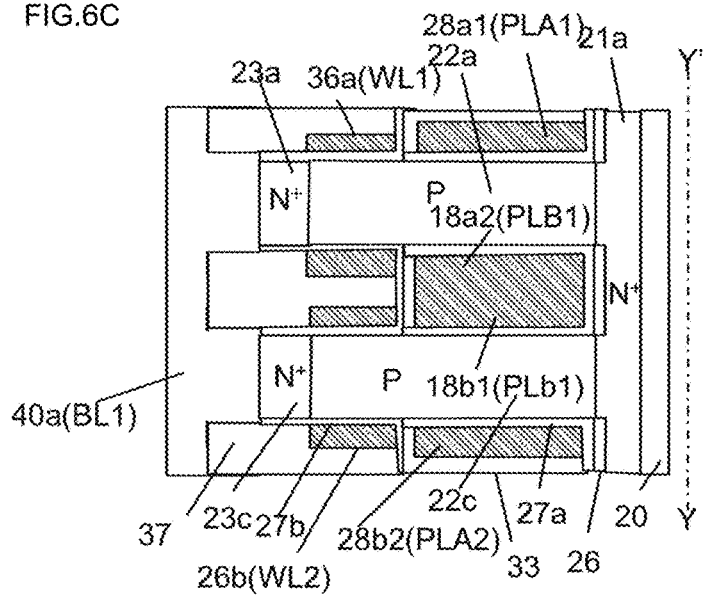
Figure 7A:
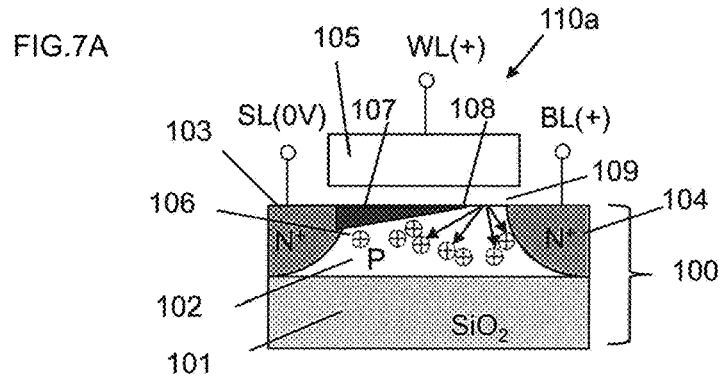
FIGS. 7A, 7B, 7C and 7D are explanatory views of a problem in the operation of a related-art capacitor-less DRAM memory cell.
Figure 7B:
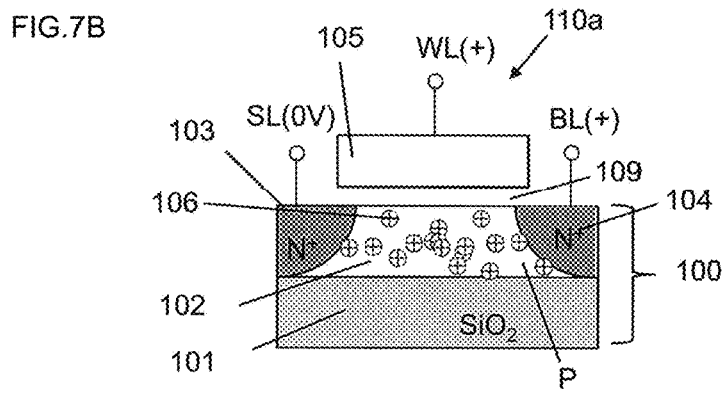
Figure 7C:
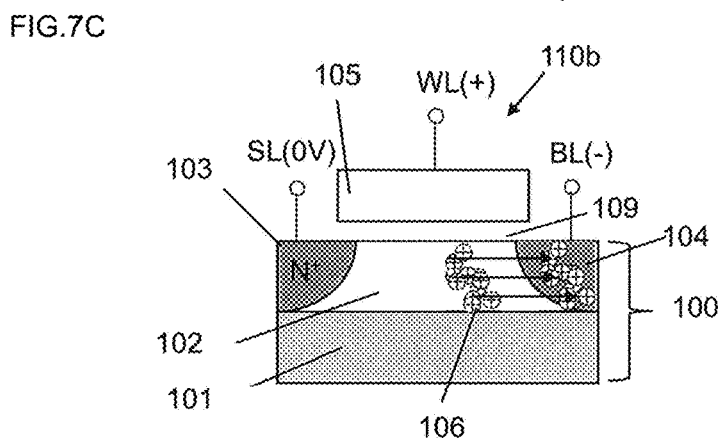
Figure 7D:
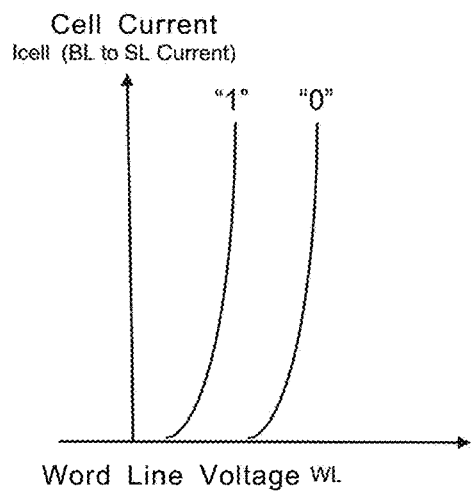
Figure 8A:
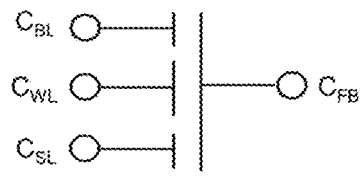
FIGS. 8A and 8B are explanatory views of a problem in the operation of a related-art capacitor-less DRAM memory cell.
Figure 8B:
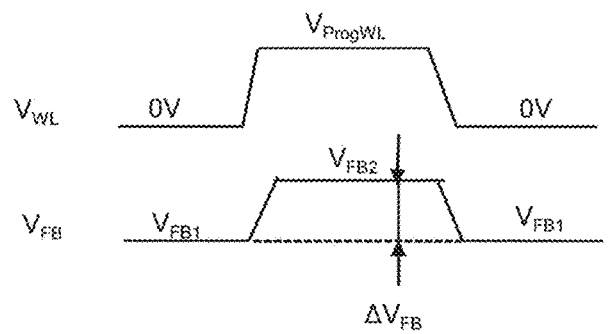
Figure 9A:
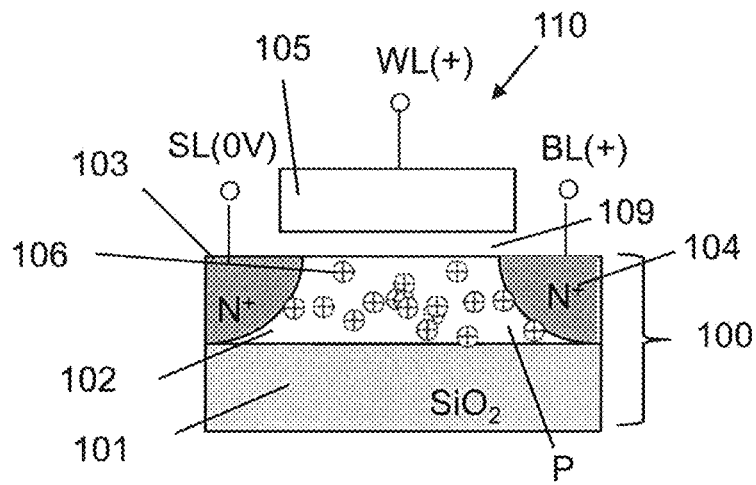
FIGS. 9A, 9B and 9C are the read operation of a related-art capacitor-less DRAM memory cell.
Figure 9B:
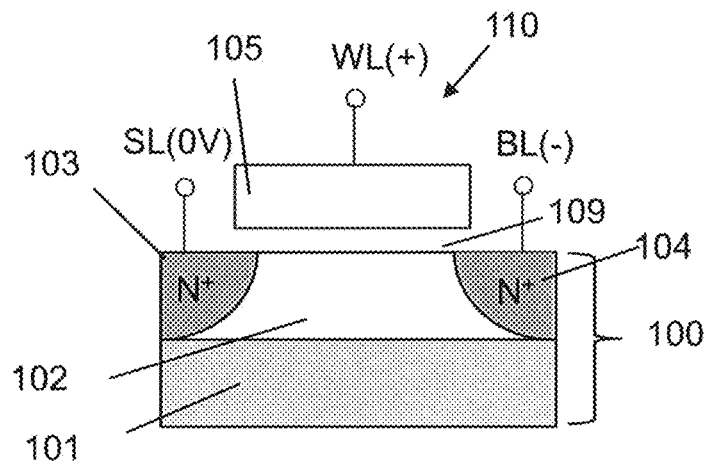
Figure 9C:
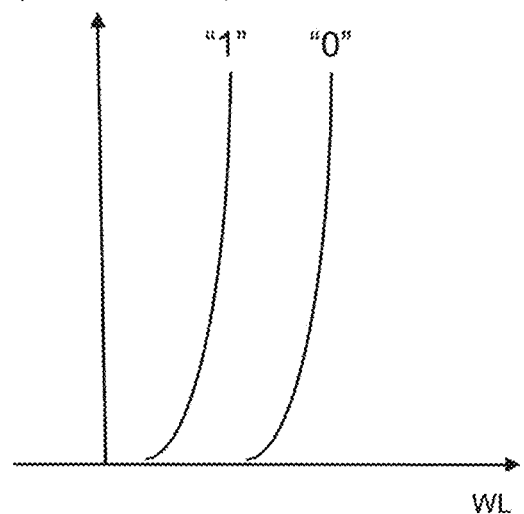

Referring to FIGS. 6A-6C, the structure of the memory cells of a dynamic flash memory according to a third embodiment will be described. FIG. 6A is a plan view extending across the first plate line conductor layer of the dynamic flash memory. FIG. 6B is a sectional view taken along line X-X' in FIG. 6A. FIG. 6C is a sectional view taken along line Y-Y' in FIG. 6A. In FIGS. 6A-6C, the same elements as in FIGS. 5A-5C are denoted by like reference signs.

A TiN layer 28B1 is disposed so as to surround the side surface of the HfO₂ layer 27a and to connect to, in plan view, side surfaces of the Si pillar 22a-22b row and the Si pillar 22c-22d row facing each other. A TiN layer 28A1 is disposed so as to be isolated from the TiN layer 28B1, to surround outer periphery portions of the Si pillars 22a and 12b, and to extend along line X-X'. A TiN layer 28A2 is disposed so as to be isolated from the TiN layer 28B1 to surround outer periphery portions of the Si pillars 22c and 22d, and to extend along line X-X'. The TiN layers 28A1 and 28A2 connect to the first plate lines PLA1 and PLA2. The TiN layer 28B1 connects to the second plate line PLB1. The other is the same as in the second embodiment having been described with reference to FIGS. 5A-5C.

This embodiment provides the following feature.
(Feature 1)

For this embodiment, in the second embodiment, the TiN layer 28a2 and the TiN layer 28b1 are formed so as to be isolated from each other. By contrast, this embodiment provides the structure not having the isolation region between the TiN layer 28a2 and the TiN layer 28b1. This enables a smaller cell area than in the dynamic flash memory cells of the second embodiment, to achieve an increase in the degree of integration of the dynamic flash memory cells.

Other Embodiments

Note that, in the first embodiment, the Si pillar 2 is formed; alternatively, another semiconductor material may be used to form a semiconductor pillar. The same applies to other embodiments according to the present invention.

In the first embodiment, the N+ layers 3a and 3b may alternatively be formed as layers of Si containing a donor impurity or another semiconductor material, or may be formed as layers different in semiconductor material. As the process of forming these, an epitaxial crystal growth process or another process may be performed to form the N+ layers. The same applies to other embodiments according to the present invention.

In the second embodiment, as the gate conductor layers connecting to the plate lines PLa1, PLa2, PLb1, and PLb2, the TiN layers 28a1, 28a2, 28b1, and 28b2 are used. Alternatively, instead of the TiN layer 28a1, 28a2, 28b1, or 28b2, a single conductor material layer or plural conductor material layers in combination may be used. Similarly, as the gate conductor layers connecting to the word lines WL1 and WL2, the TiN layers 36a and 36b are used. Alternatively, instead of the TiN layer 36a or 36b, a single conductor material layer or plural conductor material layers in combination may be used. The gate TiN layers 28a1, 28a2, 28b1, 28b2, 36a, and 36b may, in their outer portions, connect to wiring metal layers formed of W, for example. Instead of the TiN layers 28a1, 28a2, 28b1, and 28b2, low-resistance doped poly Si may be used and its upper surface may be oxidized to form the SiO₂ layer 33. In this case, as the gate conductor layer, two layers that are a thin TiN layer and a thick low-resistance doped poly Si layer may be used. The same applies to other embodiments according to the present invention.

The second embodiment and the third embodiment describe the examples in which, on the P layer 10, four Si pillars 22a to 22d are formed; the number of the pillars may be four or more.

In the first embodiment, the Si pillar 2 has a plan-view shape that is circular. Alternatively, the Si pillar 2 may have a plan-view shape that is elliptical or elongated in one direction, for example. Si pillars different in plan-view shapes can be formed in combination to form a dynamic flash memory cell. The same applies to other embodiments according to the present invention.

FIGS. 1A and 1B has been described using the Si pillar 2 having a perpendicular section that is rectangular; alternatively, the perpendicular section may be trapezoidal. In the Si pillar 2 of the dynamic flash memory cell, the section of the Si pillar 2 surrounded by the first gate insulating layer 4a and the section of the Si pillar 2 surrounded by the second gate insulating layer 4b may be different and respectively rectangular and trapezoidal. The same applies to other embodiments according to the present invention.

In FIGS. 6A-6C, a conductor layer such as a W layer may be used so as to connect to the $N^+$ layer 21a in the bottom portions of the Si pillars 22a to 22d. In FIGS. 6A-6C, the $N^+$ layer 40a extends through the Si pillars 22a to 22d; alternatively, STI (Sallow Trench Isolation) and a well structure may be used such that an $N^+$ layer extending below the Si pillars 22a and 22b and an $N^+$ layer extending below the Si pillars 22c and 22d may be electrically isolated and driven. As a result, the source line SL connecting to such an isolated $N^+$ layer can be driven independently from the adjacent source line. In this case, a conductor layer formed of, for example, a metal or an alloy for lowering the resistance of the source line is desirably formed so as to be adjacent to each of the $N^+$ layers. The same applies to other embodiments according to the present invention.

In FIGS. 1A and 1B, in order to make the gate capacitances of the first gate conductor layers 5a and 5b connecting to the plate lines PL1 and PL2 be higher than the gate capacitance of the third gate conductor layer 5c connecting to the word line WL, the gate lengths of the first gate conductor layer 5a and the second gate conductor layer 5b can be made larger than the gate length of the third gate conductor layer 5c, to thereby make the sum of the gate capacitances of the first gate conductor layer 5a and the second gate conductor layer 5b be even higher than the gate capacitance of the third gate conductor layer 5c. Also, in a structure in which the gate lengths of the first gate conductor layer 5a and the second gate conductor layer 5b are or are not made to be larger than the gate length of the third gate conductor layer 5c, for example, the film thickness of the gate insulating film of the first gate insulating layer 4a can be made smaller than the film thickness of the gate insulating film of the second gate insulating layer 4b, to thereby make the sum of the gate capacitances of the first gate conductor layer 5a and the second gate conductor layer 5b be higher than the gate capacitance of the third gate conductor layer 5c. The dielectric constants of the materials for the gate insulating layers may be changed such that the dielectric constant of the gate insulating film of the first gate insulating layer 4a is made to be higher than the dielectric constant of the gate insulating film of the second gate insulating layer 4b. A combination of some of the lengths of the gate conductor layers 5a, 5b, and 5c and the film thicknesses and the dielectric constants of the gate insulating layers 4a and 4b may be selected such that the sum of the gate capacitances of the first gate conductor layer 5a and the second gate conductor layer 5b is made to be even higher than the gate capacitance of the third gate conductor layer 5c. The same applies to other embodiments according to the present invention.

The second embodiment describes the example in which the Si pillars 22a to 22d are arranged, in plan view, in the square grid; alternatively, the pillars may be arranged in a skew grid. The same applies to other embodiments according to the present invention.

In FIGS. 1A and 1B, the third gate conductor layer 5c may be divided into, in the horizontal plane or in the perpendicular section, a plurality of conductor layers. To the divided conductor layers, driving voltages can be applied to thereby perform a dynamic flash memory operation.

For FIGS. 1A and 1B, the first gate conductor layer 5a connecting to the first plate line PL1 and the second gate conductor layer 5b connecting to the second plate line PL2 are disposed so as to be adjacent to the $N^+$ layer 3a connecting to the source line SL; alternatively, the third gate conductor layer 5c connecting to the word line WL may be disposed so as to be adjacent to the $N^+$ layer 3a and the first gate conductor layers 5a and 5b may be disposed so as to be adjacent to the $N^+$ layer 3b connecting to the bit line BL, which has been described. The same applies to other embodiments according to the present invention.

For the present invention, without departing from the broad spirit and scope of the present invention, various embodiments and modifications can be made. The above-described embodiments are provided for the purpose of describing examples of the present invention and do not limit the scope of the present invention. The examples and modifications can be appropriately combined. In addition, the embodiments from which a portion of the features has been removed as needed also fall in the scope of the technical idea of the present invention.

INDUSTRIAL APPLICABILITY

Memory-element-including semiconductor devices according to the present invention provide high-density high-performance dynamic-flash-memory-including semiconductor devices.

The invention claimed is:

1. A semiconductor-element-including memory device comprising:
   a first semiconductor base having, relative to a substrate, a central axis lying in a perpendicular direction or a horizontal direction;
   a first impurity layer and a second impurity layer connecting to both ends of the first semiconductor base;
   a first gate insulating layer disposed closer to the first impurity layer and surrounding a portion the first semiconductor base;
   a second gate insulating layer disposed closer to the second impurity layer and surrounding the first semiconductor base between the first gate insulating layer and the second impurity layer;
   a first gate conductor layer surrounding a first region in an outer periphery of the first gate insulating layer;
   a second gate conductor layer, in horizontal sectional view, isolated from the first gate conductor layer and surrounding a second region, which is different from the first region, in the outer periphery of the first gate insulating layer;
   a third gate conductor layer surrounding the second gate insulating layer; and a first insulating layer disposed between the first gate conductor layer and the third gate conductor layer and between the second gate conductor layer and the third gate conductor layer, wherein the first impurity layer, the second impurity layer, the first gate conductor layer, the second gate conductor layer, and the third gate conductor layer are disposed such that voltages applied to the first impurity layer, the second impurity layer, the first gate conductor layer, the second gate conductor layer, and the third gate conductor layer are controlled to perform a memory write operation, a memory read operation, and a memory erase operation, and wherein the first impurity layer, the second impurity layer, the first gate conductor layer, the second gate conductor layer, and the third gate conductor layer are disposed such that voltages applied to the first impurity layer, the second impurity layer, the first gate conductor layer, the second gate conductor layer, and the third gate conductor layer are controlled to perform the memory write operation of discharging, of an electron group and a hole group generated within the first semiconductor base due to an impact ionization phenomenon caused by a current flowing between the first impurity layer and the second impurity layer or a gate induced drain leakage current, the electron group from the first semiconductor base and causing a portion of or entirety of the hole group to remain within the first semiconductor base, and the memory erase operation of discharging, from the first semiconductor base, the remaining hole group of the hole group.

2. The semiconductor-element-including memory device according to claim 1, being configured to perform an operation of applying, to the second gate conductor layer, a lower voltage than in the first gate conductor layer to store the hole group generated due to the impact ionization phenomenon or the gate induced drain leakage current, in the first semiconductor base closer to the second gate conductor layer.

3. The semiconductor-element-including memory device according to claim 1, wherein a wiring line connected to one of the first impurity layer and the second impurity layer is a source line, a wiring line connected to another of the first impurity layer and the second impurity layer is a bit line, a wiring line connecting to the first gate conductor layer is a first driving control line, a wiring line connecting to the second gate conductor layer is a second driving control line, and a wiring line connecting to the third gate conductor layer is a word line, and the semiconductor-element-including memory device is configured to apply voltages to the source line, the bit line, the first driving control line, the second driving control line, and the word line to perform the memory erase operation and the memory write operation.

4. The semiconductor-element- including memory device according to claim 1, wherein a first gate capacitance being a sum of a gate capacitance between the first gate conductor layer and the first semiconductor base and a gate capacitance between the second gate conductor layer and the first semiconductor base is higher than a second gate capacitance between the third gate conductor layer and the first semiconductor base.

5. A semiconductor-element-including memory device comprising:

at least first to fourth memory devices each including the memory device according to claim 1 formed in a direction perpendicular to the substrate, the first and the second memory devices being disposed, in plan view, on a first straight line, the third memory device being disposed, in plan view, on a second straight line parallel to the first straight line so as to be adjacent to the first memory device, the fourth memory device being disposed on the second straight line so as to be adjacent to the third memory device and the second memory device;

a fourth gate conductor layer connecting together the first gate conductor layer of the first memory device and the first gate conductor layer of the second memory device, and extending parallel to the first straight line;

a fifth gate conductor layer connecting together the second gate conductor layer of the first memory device and the second gate conductor layer of the second memory device, and extending parallel to the first straight line;

a sixth gate conductor layer connecting together the first gate conductor layer of the third memory device and the first gate conductor layer of the fourth memory device, and extending parallel to the first straight line;

a seventh gate conductor layer connecting together the second gate conductor layer of the third memory device and the second gate conductor layer of the fourth memory device, and extending parallel to the first straight line;

an eighth gate conductor layer connecting together the third gate conductor layer of the first memory device and the third gate conductor layer of the second memory device, and extending parallel to the first straight line; and a ninth gate conductor layer connecting together the third gate conductor layer of the third memory device and the third gate conductor layer of the fourth memory device, and extending parallel to the first straight line.

6. The semiconductor-element-including memory device according to claim 5, wherein driving voltages supplied to the fourth gate conductor layer and the sixth gate conductor layer synchronize with a driving voltage supplied to the first gate conductor layer, and driving voltages supplied to the fifth gate conductor layer and the seventh gate conductor layer synchronize with a driving voltage supplied to the second gate conductor layer.

7. The semiconductor-element-including memory device according to claim 5, wherein the fifth gate conductor layer and the sixth gate conductor layer connect to each other to form a tenth gate conductor layer, and the fourth gate conductor layer and the seventh gate conductor layer synchronize with a driving voltage supplied to the first gate conductor layer, and the tenth gate conductor layer synchronizes with a driving voltage supplied to the second gate conductor layer.

8. The semiconductor-element-including memory device according to claim 1, wherein the first gate conductor layer includes a first conductor layer covering the first region of the first gate insulating layer and a first wiring conductor layer covering the first conductor layer, and the second gate conductor layer includes a second conductor layer covering the second region of the first gate insulating layer and a second wiring conductor layer covering the second conductor layer.

9. The semiconductor-element-including memory device according to claim 1, wherein the third gate conductor layer includes a third conductor layer covering the second gate insulating layer and a third wiring conductor layer covering the third conductor layer.

* * * * *

UNITED STATES PATENT AND TRADEMARK OFFICE
CERTIFICATE OF CORRECTION

PATENT NO. : 12,016,172 B2
APPLICATION NO. : 17/713839
DATED : June 18, 2024
INVENTOR(S) : Nozomu Harada and Koji Sakui It is certified that error appears in the above-identified patent and that said Letters Patent is hereby corrected as shown below:

In the Claims

Column 19, Claim 1, Line 18, delete "laver" and replace with -- layer --

Signed and Sealed this
Thirtieth Day of July, 2024

Katherine Kelly Vidal
*Director of the United States Patent and Trademark Office*